United States Patent [19]

Kruse et al.

[11] Patent Number: 4,799,126
[45] Date of Patent: Jan. 17, 1989

[54] OVERLOAD PROTECTION FOR D.C. CIRCUITS

[75] Inventors: James W. Kruse, New Haven, Ind.; W. Eric Windle, Antwerp, Ohio

[73] Assignee: Navistar International Transportation Corp., Chicago, Ill.

[21] Appl. No.: 39,048

[22] Filed: Apr. 16, 1987

[51] Int. Cl.⁴ .......................................... H02H 3/087
[52] U.S. Cl. ..................................... 361/101; 361/93; 307/10 R; 307/10 LS; 340/76; 340/80; 340/81 F; 340/94; 340/95; 315/83; 318/78
[58] Field of Search .................. 361/93, 100, 101; 307/9, 10 R, 10 LS; 340/76, 80, 81 F, 84, 94, 95; 315/81, 82, 83; 290/48, 38 R; 318/66, 78, 811

[56] References Cited

U.S. PATENT DOCUMENTS

| | | | |
|---|---|---|---|
| 3,355,624 | 11/1967 | Guyton et al. | 315/83 |
| 3,992,650 | 11/1976 | Iwasa et al. | 361/101 |
| 4,258,292 | 3/1981 | Kassfeldt | 307/10 LS X |
| 4,309,639 | 1/1982 | Thrower, Jr. et al. | 307/10 LS X |
| 4,360,851 | 11/1982 | Zundel | 361/59 |
| 4,408,245 | 10/1983 | Pryor | 361/100 X |
| 4,435,648 | 3/1984 | Goode, III | 307/10 R |
| 4,438,356 | 3/1984 | Fleischer | 307/571 |
| 4,491,892 | 1/1985 | Lehmann et al. | 361/101 |
| 4,493,002 | 1/1985 | Pelowski et al. | 361/93 |
| 4,495,536 | 1/1985 | Bynum | 361/91 |
| 4,530,023 | 7/1985 | Brown | 361/58 |
| 4,546,401 | 10/1985 | Svedberg | 361/91 |
| 4,574,673 | 3/1986 | Tedeschi et al. | 307/10 R X |
| 4,578,591 | 3/1986 | Floyd et al. | 307/10 R |
| 4,581,540 | 4/1986 | Gurjardo | 307/117 |
| 4,581,551 | 4/1986 | Campbell, Jr. | 361/101 X |
| 4,595,966 | 6/1986 | Huber et al. | 361/101 X |
| 4,644,232 | 2/1987 | Nojiri et al. | 318/66 |
| 4,661,717 | 4/1987 | Nishioka | 307/10 LS |
| 4,670,736 | 6/1987 | Ulrich | 307/10 LS X |
| 4,719,400 | 1/1988 | Kurakake et al. | 318/811 |

OTHER PUBLICATIONS

Mitchell—"1984 Imported Cars & Trucks Tune-Up Mechanical Service & Repair", BMW 318i, p. 3, 4–19, 116 thru 136.

Jurgen, "Coming From Detroit: Networks on Wheels", IEEE Spectrum, Jun. 1986, pp. 53–59.

Jurgen, "Multiplexed Car Wiring Called Next Automotive Wave," The Institute, vol. 10, No. 5, May 1986, pp. 1 & 13.

"SMT 12 Smart-SIPMOS Intelligent Monolithic Power Switch", Siemens Components, Inc, #CG/1200-045-121, Oct. 1985.

"MPC1500 Monolithic Logic-To-Power Switch", Motorola Semiconductor Products Inc., #17854-3, Dec. 1985.

"International Electrical Circuit Diagrams CO-9670", Navistar International Corporation, #1087427R1, 1986, pp. 1, 46, 49–54.

Primary Examiner—A. D. Pellinen
Assistant Examiner—Derek S. Jennings
Attorney, Agent, or Firm—F. David Aubuchon; Dennis K. Sullivan

[57] ABSTRACT

Protection for D.C. electrical circuit branches against incipient overloads comprises the use of semiconductor devices known as intelligent switches. An intelligent switch comprises a main controlled conduction path whose conductivity is controlled by an external control input. The semiconductor architecture is configured to possess internal self-protection for the main controlled conduction path against incipient current and/or temperature rises exceeding the device's rating by rendering the main controlled conduction path non-conductive when such incipient conditions are sensed. The invention, recognizing that this internal self-protection attribute can be used also to provide protection for external circuit components connected to the switch in the branch, further comprises the elimination of external protective devices from the branch such that the intelligent switch itself provides the entire overload protection within the branch. The invention is especially beneficial in automotive electrical application, imparting improvements to particular specific circuits of automotive electrical systems.

24 Claims, 8 Drawing Sheets

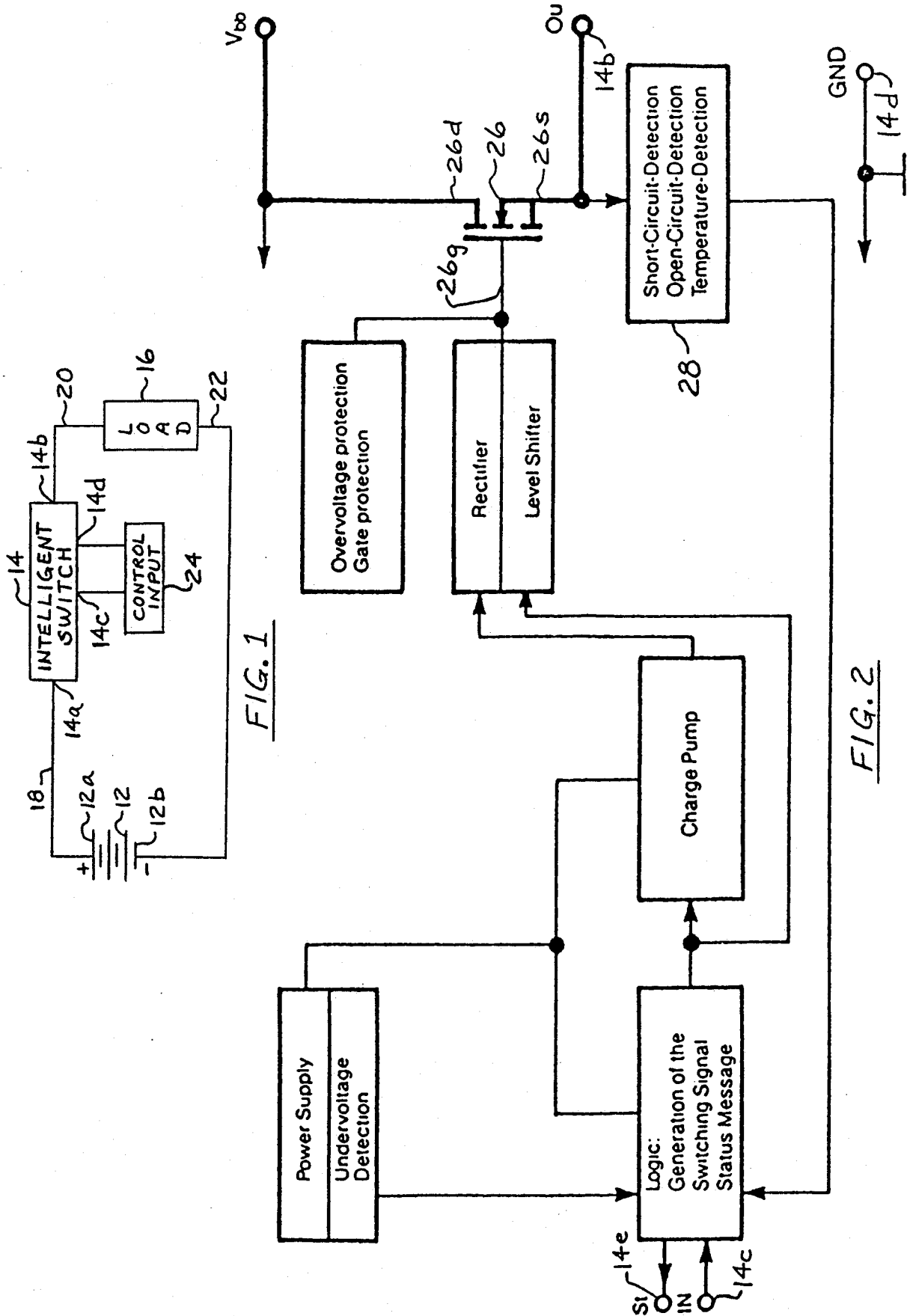

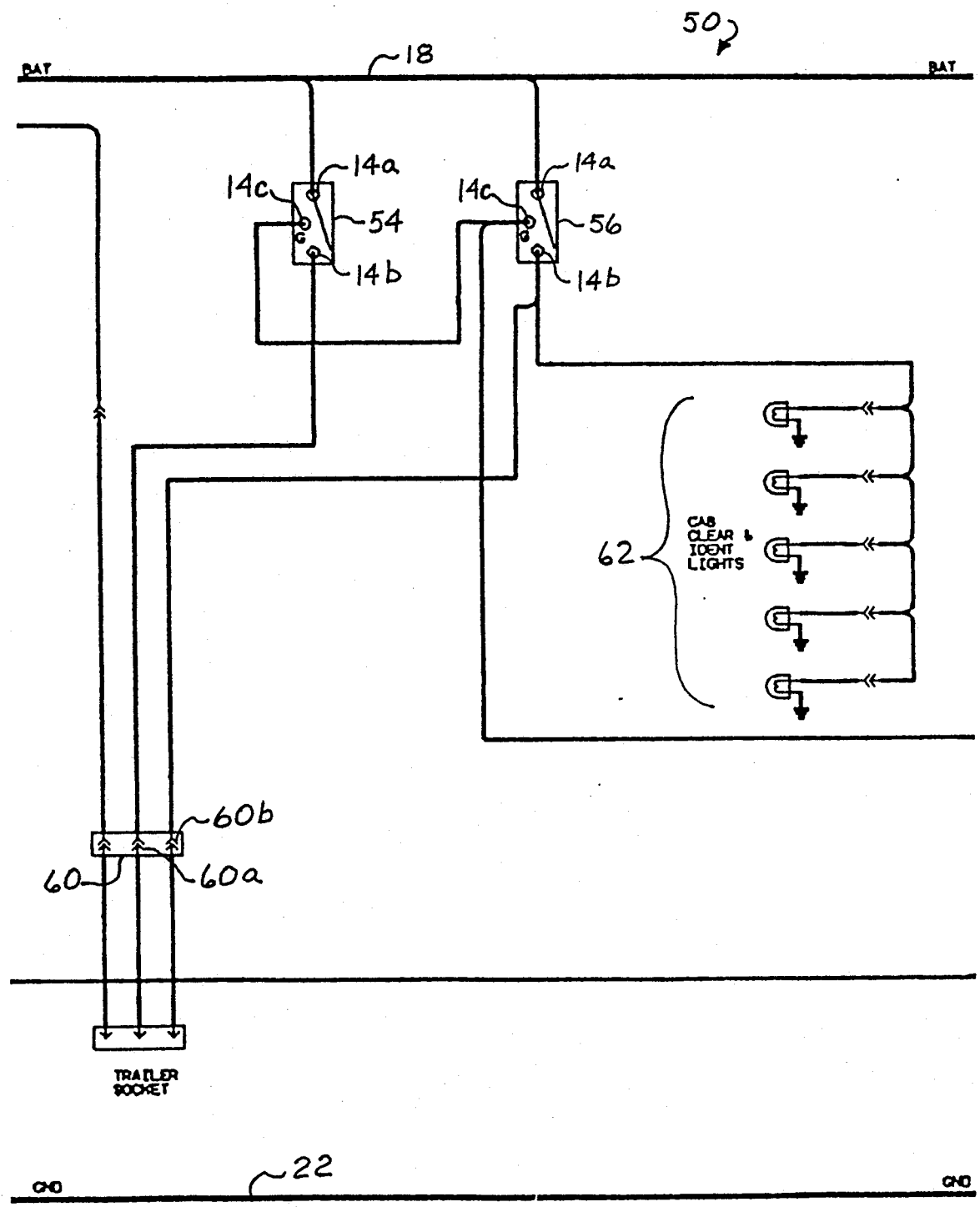

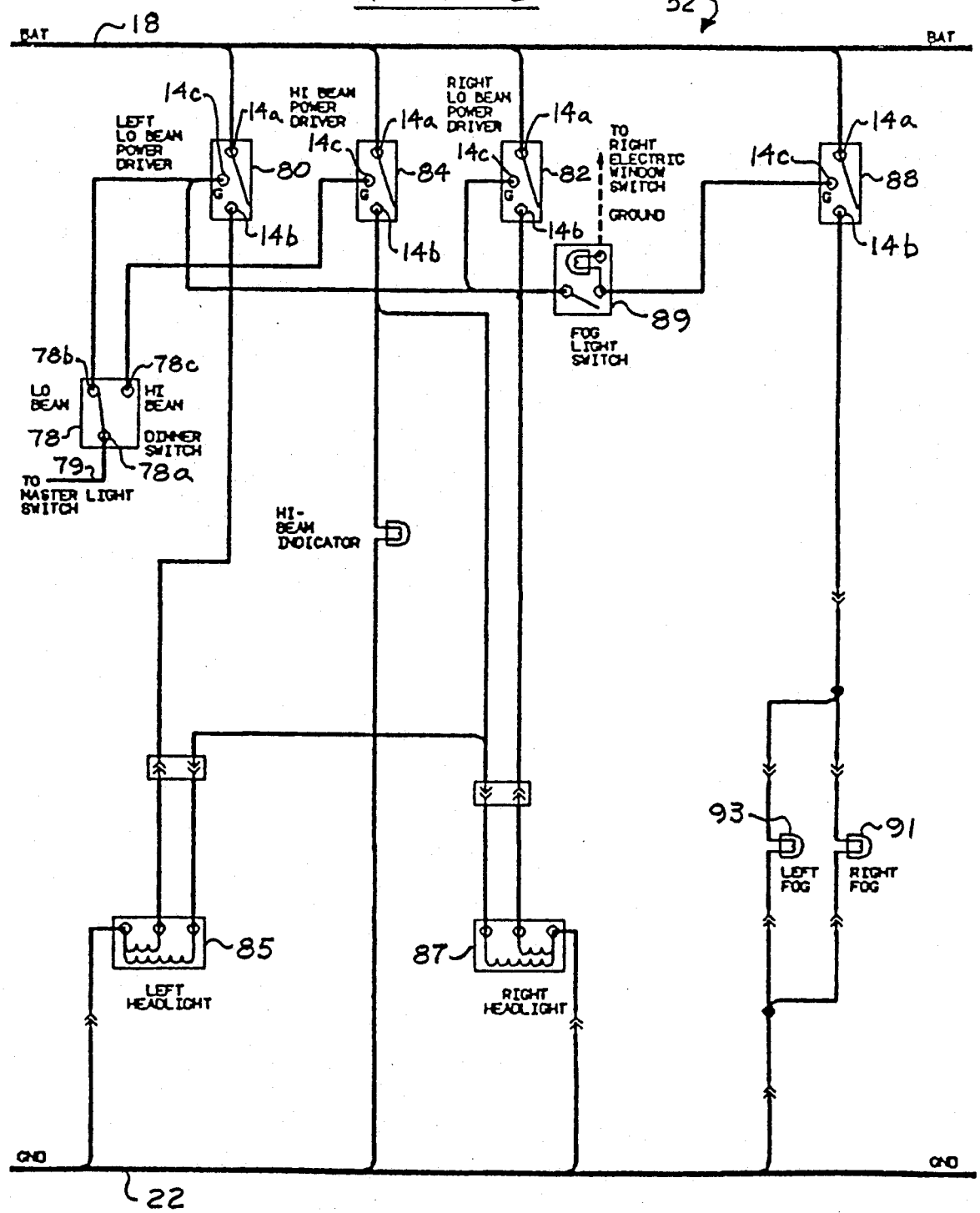

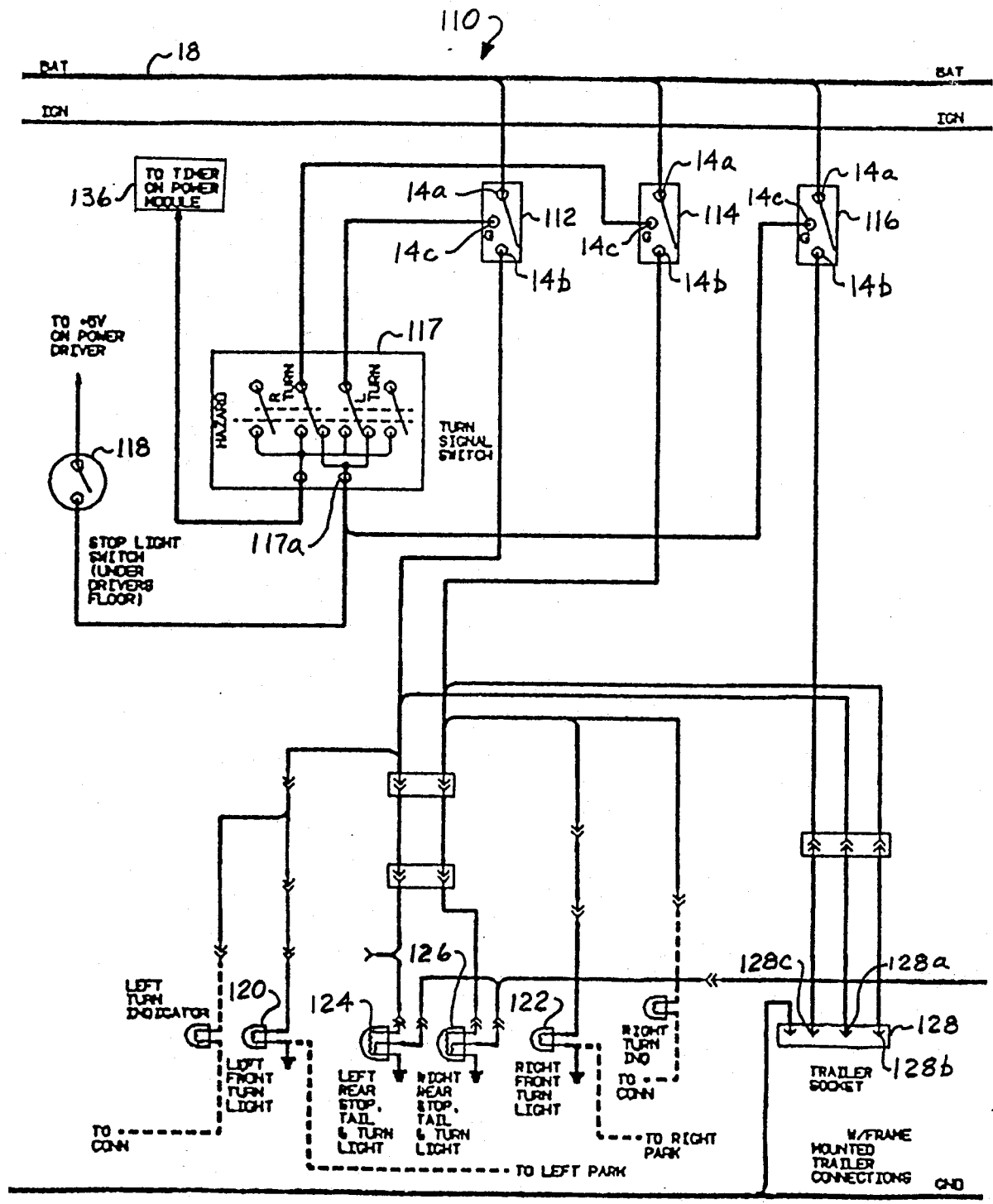

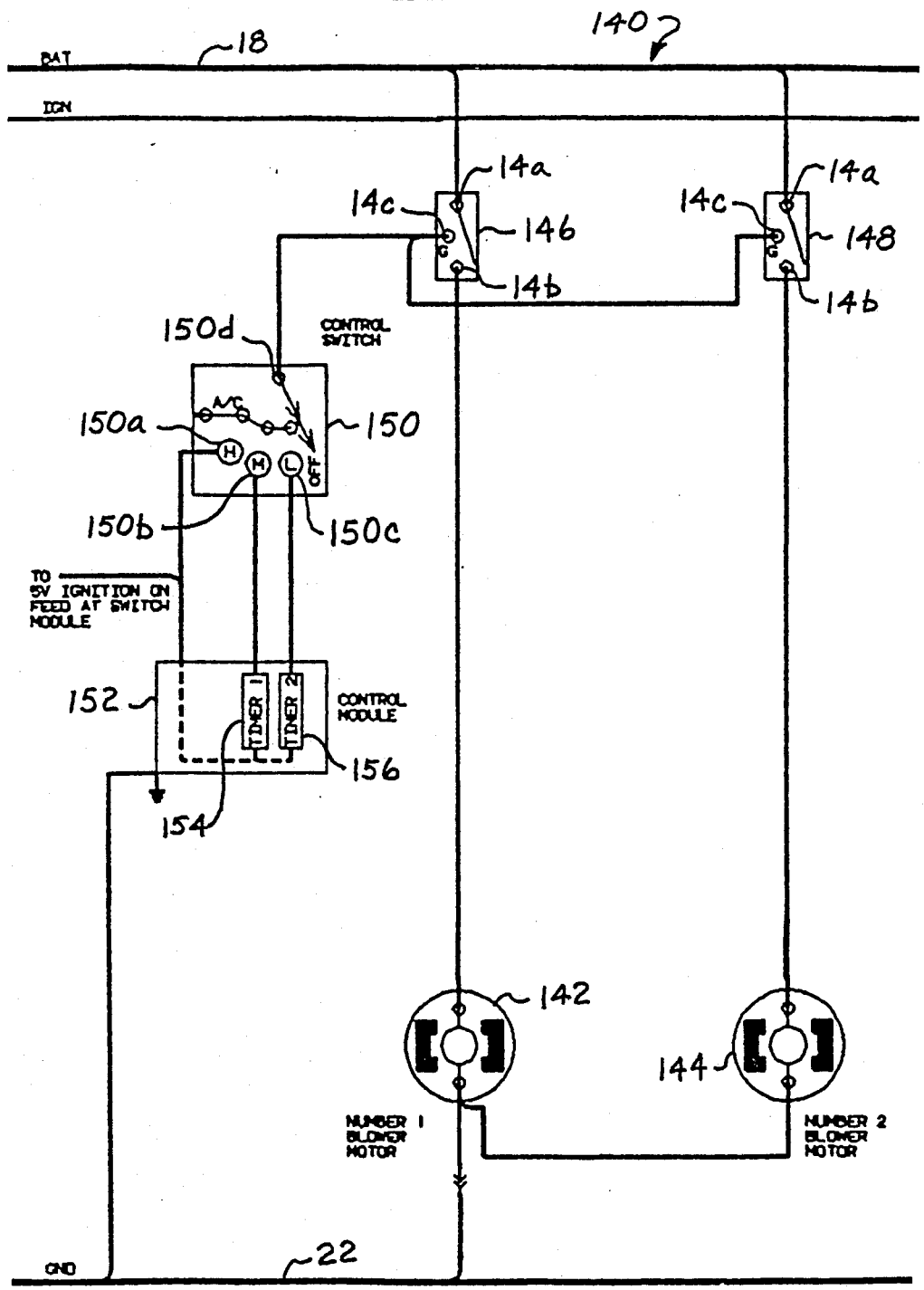

OVERLOAD PROTECTION FOR D.C. CIRCUITS

BACKGROUND AND SUMMARY OF THE INVENTION

This invention relates generally to D.C. electrical circuits and more particularly to a novel means for protection of electrical circuits from electrical overloads and short circuits. The invention is especially useful in automotive electrical systems, and principles will be disclosed in connection with automotive electrical circuits.

The number of electrical circuits in automotive vehicles has increased over the years. In today's passenger cars and trucks, there are numerous electrical devices which are used for various purposes such as illumination, control, power, and instrumentation, for example. While the advent of electronics has given rise to major changes in automotive electrical systems, conventional forms of circuit protection devices, i.e., fuses and circuit breakers, continue to be used, and in increasing numbers as the number of circuits in the electrical systems increases. The common technique for providing protection against shorts, overloads, and other types of electrical problems or conditions is to include a circuit breaker or fuse in line, i.e., in series, with the wiring circuit being protected. The protected device can be the wire and/or electrical device. The necessity for having circuit protection devices is well documented and need not be explained here. With increasing numbers of circuits, and the correlative need for an increased number of protective devices, today's typical automotive vehicle comprises a panel devoted essentially exclusively to the mounting of most of these protective devices in a single location. The panel, or fuse block as it is sometimes called, comprises multiple compartments for the individual protective devices. Associated with these compartments are receptacles to provide for the replaceable mounting of the protective devices in the associated circuits. Accordingly, the panel comprises a large number of individual parts in assembled relationship, and it occupies a certain amount of space in an area of the vehicle where space is typically at a premium. A large number of wires attach to the panel to carry current to and from the various protective devices, and in order to serve the grouping of the protective devices in the panel, complexities must be introduced into the associated wiring harnesses.

Despite the advances which have taken place in the incorporation of electrical and electronic technology into today's automotive vehicle electrical circuits, they retain the fuse and circuit breaker panel concept with its attendant large number of individual protective devices to provide protection for the various individual circuits.

There are several ways to protect an electrical device without a circuit breaker or fuse, but most of the ways add several parts to the circuit and typically degrade the performance of the electrical circuit, such as by added voltage drop, higher power dissipation, etc. These protection methods are not known to enjoy any significant commercial use because of disadvantages such as those just mentioned.

The present invention relates to a novel means for protection of D.C. electrical cicuits which affords very significant advantages in automotive usage. One important advantage is that the fuse and circuit breaker panel concept of protection can be eliminated, thereby reducing the large number of individual circuit devices (i.e., fuses and circuit breakers) required to provide the protective function, and at the same time, freeing space because there is no longer a need for a separate panel.

The invention embodies the protective function in a semiconductor device sometimes commonly known as an intelligent switch. An intelligent switch comprises an internal controlled conduction path whose conductivity is controlled by an external control input. The switch contains another internal portion which monitors current flow through the main controlled conduction path and serves to internally interrupt the flow through the path in response to incipiency of current or temperature exceeding the rating of the main controlled conduction path.

The invention arises through the recognition that what is customarily considered in the art to be an electronic switch which has internal protection can also provide protection for the external components associated with it in a circuit branch such that separate external circuit protection devices are unnecessary in the branch. The invention possesses not only a generic aspect but also aspects which are specific to certain particular circuit embodiments. Various attributes will be seen in the several embodiments hereinafter disclosed.

The foregoing features, advantages and benefits of the invention, along with additional ones, will be seen in the ensuing description and claims which should be considered in conjunction with the accompanying drawings. The drawings disclose a preferred embodiment of the invention according to the best mode contemplated at the present time in carrying out the invention.

BRIEF DESCRIPTION OF THE DRAWINGS

FIG. 1 is a generalized schematic diagram of circuit embodying principles of the invention.

FIG. 2 is a schematic diagram, mostly in block diagram form, of one of the circuit elements of FIG. 1 showing greater detail.

FIGS. 4a and 4b is a schematic diagram of a second example of specific circuitry embodying principles of the invention.

FIGS. 5a and 5b is a schematic diagram of a third example of specific circuitry embodying principles of the invention.

FIG. 6 is a schematic diagram of a fourth example of specific circuitry embodying principles of the invention.

FIG. 7 is a schematic diagram of a fifth example of specific circuitry embodying principles of the invention.

DESCRIPTION OF THE PREFERRED EMBODIMENT

Figure 3:
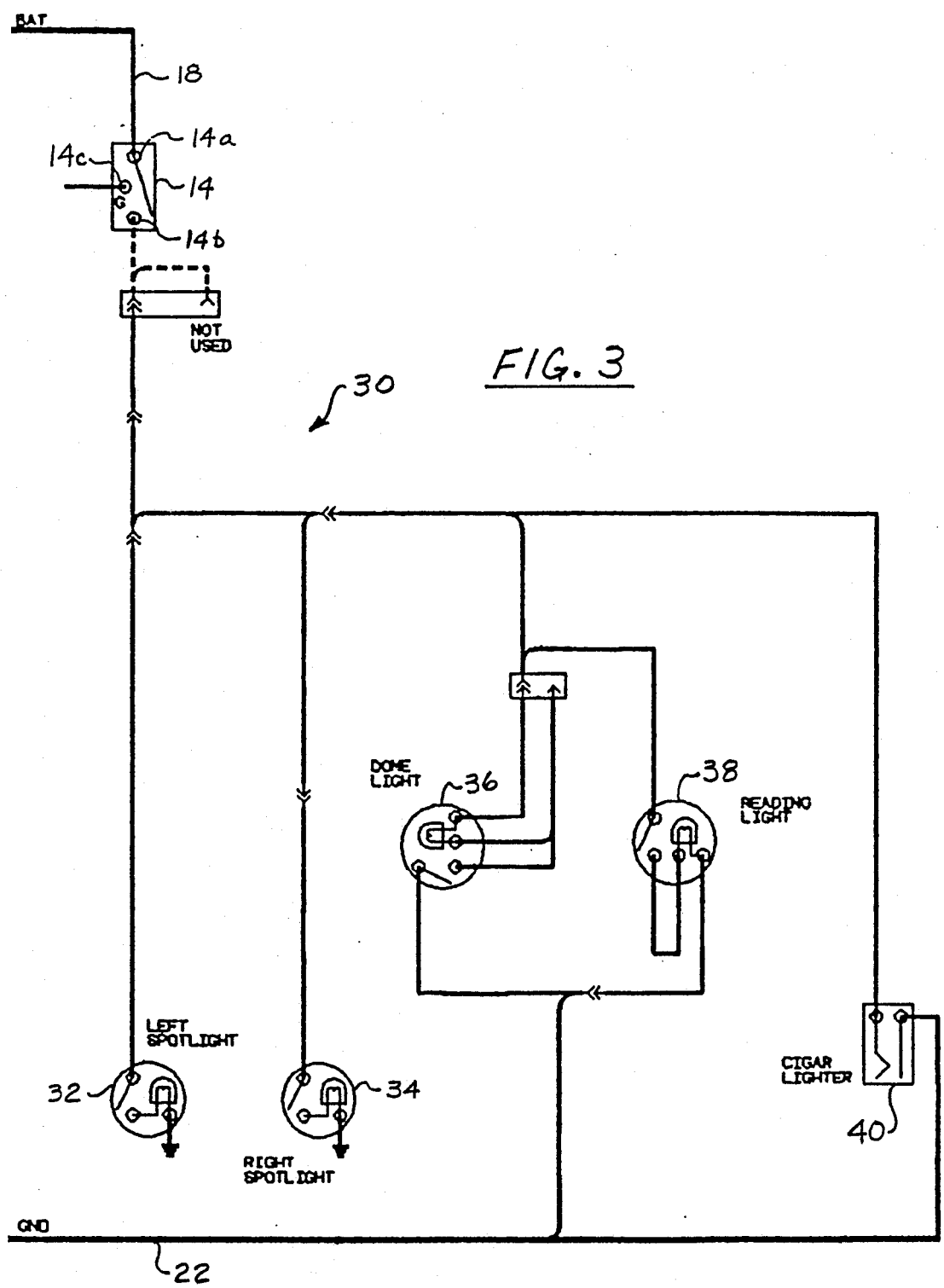
FIG. 3 is a schematic diagram of a first example of specific circuitry embodying principles of the invention.

FIG. 1 portrays a circuit 10 which is illustrative of general principles of the invention. The circuit comprises a D.C. power supply 12, a switch 14, and a load 16, the latter two elements being in a series circuit across power supply 12. The power supply is illustrated as a battery having a positive terminal 12a and a negative terminal 12b. The latter terminal is connected to ground to make a negative ground system.

Switch 14 is the type which is commonly referred to as an "intelligent switch". It is a semiconductor device which contains an internal main conduction path whose conductivity is selectively controlled by an input thereby performing a switch function. It also comprises an internal protector section which senses the current flowing through the main conduction path and interrupts the current flow through the main conduction path in response to incipiency of current or temperature exceeding the rating of the main conduction path, thereby endowing the device with internal self-protection.

Switch 14 has a plurality of terminals via which it connects to external circuit components. FIG. 1 shows four terminals designated 14a, 14b, 14c, and 14d. Terminals 14a and 14b are associated with the main conduction path through the device, and terminals 14c and 14d are associated with control of the conductivity of the main conduction path.

Conductors such as insulated wires, printed circuits, etc., provide the electrical connection of power supply 12, switch 14, and load 16 in circuit. A conductor 18 connects terminal 12a with terminal 14a; a conductor 20 connects terminal 14b with the positive side of load 16; and a conductor 22 connects the negative side of load 16 with terminal 12b.

Terminals 14c, 14d are shown connected to a control input 24 which exercises control over the conductivity of the main conduction path through switch 14 between the power supply and the load. In other words control input 24 serves to turn the current from power supply 12 to load 16 on and off via switch 14.

As described earlier, external protective devices have heretofore been required in automotive electrical circuit branches to protect against otherwise potentially damaging overloads or shorts in the branches. The present invention in its several aspects arises through the recognition that the intelligent switch can provide protection not only for itself, but in doing so, also provide protection for other circuit elements connected in external circuit relation with it in the branch. With this recognition, the invention further comprises freeing the branch of external protective devices such that the entire overload protection within the branch circuit connected across the power supply is provided solely by intelligent switch 14.

As also mentioned earlier, this reduces the number of external components in a circuit, resulting in a significant savings in cost, and assembly time as well, and importantly without sacrificing circuit protection. Where a large electrical system, such as in a car or truck, is involved, and where the system is produced in large numbers, a substantial cost savings is attained by the elimination of what the invention recognizes as now-redundant external protective devices. Accordingly, the present invention possesses significant commercial advantages.

FIG. 2 illustrates further detail of a representative intelligent switch 14. The four terminals already described are designated accordingly; there is also a fifth terminal 14e for supplying an output signal indicative of the switch's status. The internal construction of switch 14 comprises semiconductor materials configured to perform particular circuit functions as shown in the Fig. by the labelled block diagrams. The illustrated configuration is representative of a device available from Siemens Components, Inc. and identified as a SMT-12 "Smart-Sipmos" intelligent monolithic power switch. Motorola, Inc. offers an equivalent device having the designation MPC 1500, and other companies offer other equivalent devices.

The main controlled conduction path through the device comprises a mosfet 26 whose drain 26d and source 26s are connected respectively to terminals 14a and 14b. The mosfet's gate 26g is connected internally of the device in association with the several internal semiconductor circuit sections labelled in the blocks of the drawing. Terminal 14c receives the control input signal which acts via the several internal circuit sections to control the mosfet, and thereby turn the current to the load off and on according to the condition of the input signal control. Terminal 14d is grounded and the potential at terminal 14c is switched between ground and a higher positive voltage to selectively operate switch 14. Terminal 14e provides the status signal.

Importantly, the internal semiconductor structure contains a detector section 28 associated with the mosfet. This section senses current passing through the mosfet between drain 26d and source 26s. In turn it exercises overriding control, via feedback, over the control input signal at terminal 14c to render the mosfet non-conductive in response to detection of incipient overloading of the mosfet. In so protecting its internal mosfet, the intelligent switch also protects the associated external circuit elements thereby eliminating the need for separate external protection devices such as fuses, circuit breakers, etc.

Further aspects of the invention involve the application of the general principles to particular circuits which are disclosed in the ensuing description with reference to the further drawing FIGS. 3-7.

FIG. 3 illustrates an embodiment of the invention in one circuit 30 of a truck's or highway tractor's electrical system. The numerals 18 and 22 represent the respective conductors from the positive and negative battery terminals 12a, 12b. Terminals 14a, 14b and 14c are the only terminals of switch 14 portrayed in FIG. 3, and it is to be appreciated that the remaining two terminals 14d, 14e, although not shown in FIG. 3, are in fact present, as described earlier. For clarity and convenience in ensuing description and illustration, this same manner of portraying intelligent switches will be employed in subsequent Figs. as well.

Terminal 14c is shown connected directly to terminal 14a in FIG. 3. Accordingly, the main controlled conduction path through the intelligent switch between terminals 14a and 14b is rendered continuously conductive so long as there is a positive battery voltage on conductor 18. The positive battery voltage is therefore transmitted through the intelligent switch so as to be available to the several load devices which connect in parallel fashion between terminal 14b and ground.

These load devices comprise a pair of spotlights 32 and 34 respectively, a dome light 36, a reading light 38, and a cigar lighter 40. Associated with each of the lighting devices 32, 34, 36, and 38 is an associated switch which can be turned on and off at the pleasure of the vehicle operator. The cigar lighter 40 is operated in a conventional manner.

In circuit 30 the intelligent switch functions in the manner of a circuit breaker rather than as a control switch for intentionally switching a load on and off as desired. In operation therefore, switch 14 provides continuous circuit continuity between terminals 14a and 14b unless an overload occurs. The circuit also illustrates that a number of branch circuits can be connected to the load side of the intelligent switch. The size of the electrical load which can be safely connected to a single intelligent switch depends upon the current carrying capacity of the switch. In functioning in the manner of a circuit breaker, the intelligent switch of FIG. 3 functions to protect the loads and associated wiring conductors by rendering the conductive path between terminals 14a and 14b non-conductive when an overload is sensed.

Depending upon the specific characteristics of the particular intelligent switch used, the terminal 14c may not be suited to accept the full battery voltage (typically 12 V.D.C.), and therefore an attenuator (not shown) may be interposed between the battery and terminal 14c to reduce the voltage to a lower level.

Figure 4B:
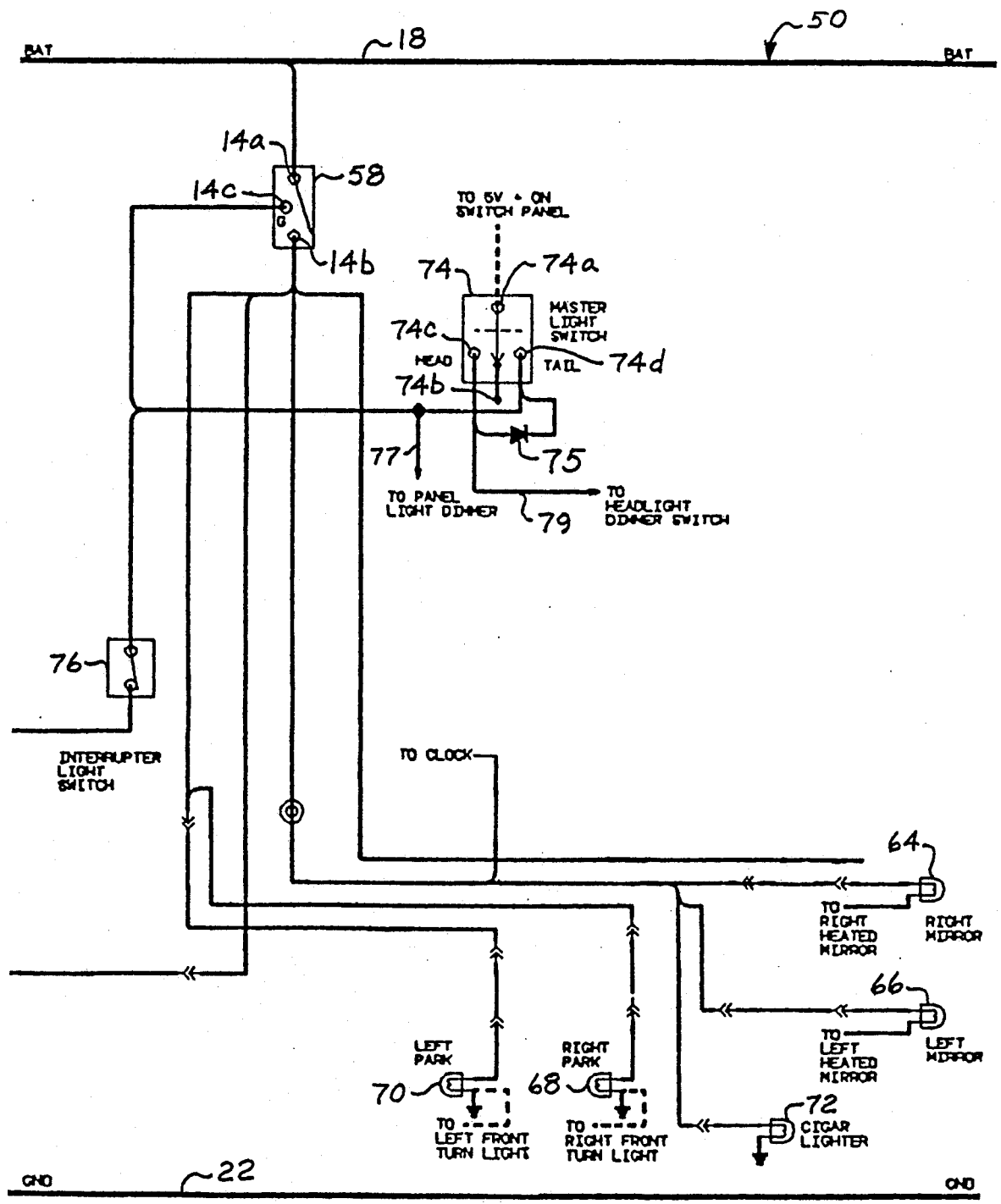

FIG. 4 illustrates a second circuit 50 embodying principles of the invention in one portion of the truck's lighting circuit. A further portion of the lighting circuit is contained in a portion of the circuit identified by the reference numeral 52 in FIG. 5, and it will be appropriate to consider both circuits 50 and 52 together.

Figure 5A:
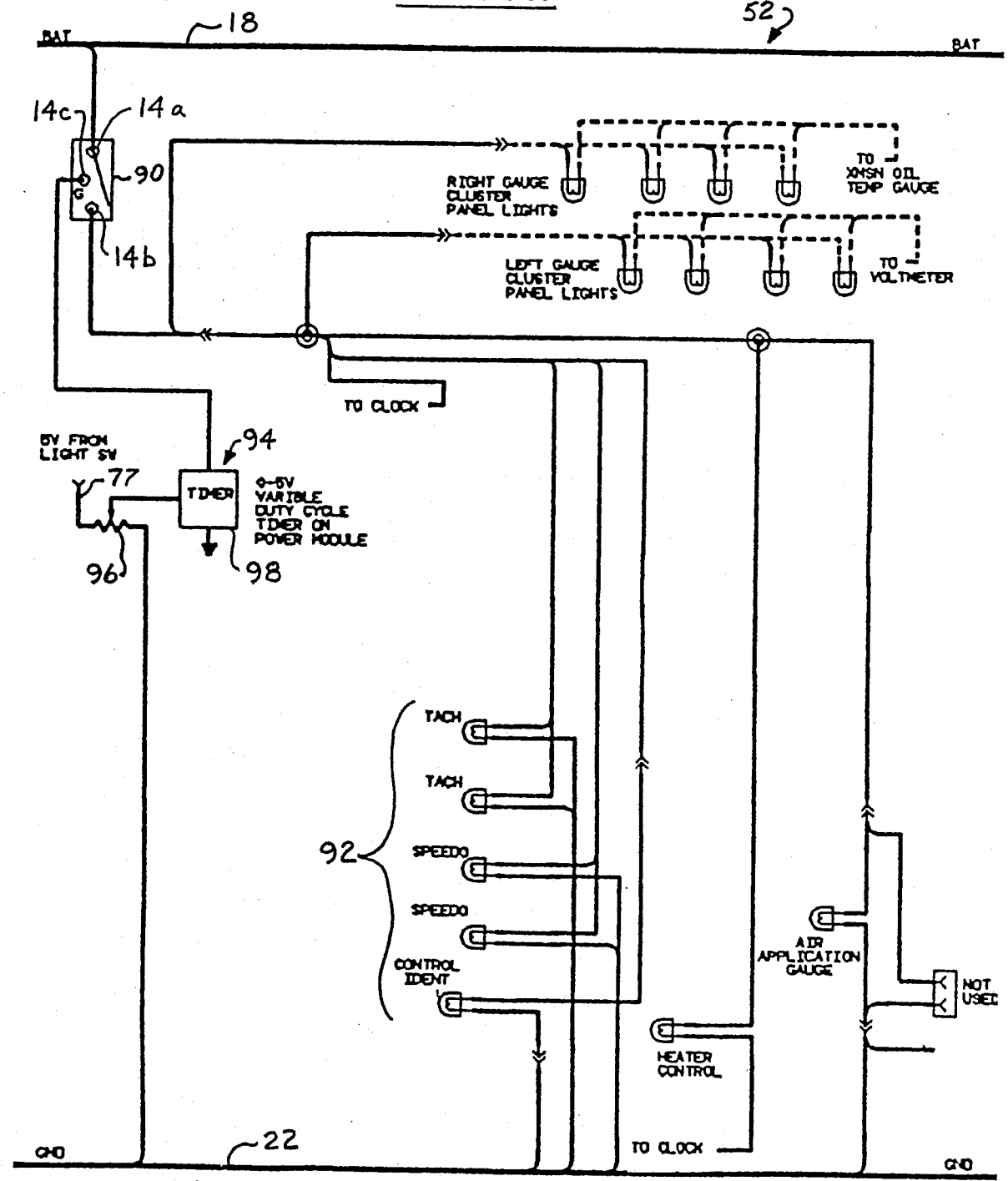

In both circuits of FIG. 4 and FIG. 5 the conductors designated by the reference numerals 18 and 22 are at the positive and negative battery potentials respectively.

Circuit 50 contains three intelligent switches 54, 56, 58 which, while identified by their own particular reference numerals, will retain for convenience in description, the previous terminal designations 14a, 14b, 14c. The terminal 14a of each of the three switches 54, 56, 58 is connected directly to conductor 18. The load for switch 54 is one portion of the marker lamps on a trailer which is hauled by the truck or tractor containing circuit 50. Hence, the load terminal 14b of switch 54 is connected to one terminal 60a of a socket 60 which is adapted to connect with a mating plug (not shown) on the trailer for the trailer marker lamps.

The load for switch 56 comprises the truck's or tractor's own set of clearance and identification lights 62 (marker lamps) and also the remaining portion of the associated trailer's marker lamps. Hence, the load on switch 56 branches to lamps 62 and to a terminal 60b of the socket 60 for feeding the remaining trailer marker lamps.

The load on switch 58 comprises two mirror lamps 64, 66, two parking lamps 68, 70 on the exterior of the vehicle, and an illumination lamp 72 for the cigar lighter. Additional branches leading to further loads are partially illustrated in FIG. 4.

The terminals 14c of the three switches 54, 56, 58 are under the common control of a master light switch 74. The master light switch serves to selectively connect an input terminal 74a to three output terminals 74b, 74c, 74d, designated off, head and tail, respectively. Terminal 74a is connected to a positive potential reference. The head and tail terminals 74c, 74d are connected together by a diode 75 poled as illustrated.

When the master light switch is in the off position (74a connected to 74b), none of the switches 54, 56, 58 can be rendered conductive. When it is in the head position (74a connected to 74c), the positive potential reference at input terminal 74a is transmitted to terminal 74c. This forward biases diode 75 and renders switch 58 conductive; it also renders switches 54 and 56 conductive via a normally closed interrupter light switch 76 which is in the line from terminal 74d to terminal 14c of both switches 54, 56. Therefore, the lamp loads connected to the three switches 54, 56, and 58 are illuminated when the master light switch is in the head position.

The provision of the interrupter switch between master light switch 74 and the two intelligent switches 54, 56 provides the vehicle operator with means for giving the standard highway signaling feature of momentarily turning the marker lamps off without concurrently turning off the instrument panel lamps, the headlamps, and the tail and parking lamps.

Terminal 74d is further connected to an instrument panel lights portion of circuit 52 in FIG. 5 and to a headlights portion also in FIG. 5. With switch 74 in the head position, positive reference potential is transmitted to those two portions of circuit 52 causing the instrument panel lamps and the headlamps to illuminate. Details of circuit 52 will be described later.

When the master light switch 74 is in the tail position (74a connected to 74d), switches 54, 56, and 58 are rendered conductive to cause the lamps of FIG. 4 and the instrument panel lamps of FIG. 5 to illuminate; the headlamps of FIG. 5 will not illuminate however because diode 75 is now reversed biased preventing a feed of the positive potential reference at 74d to a headlamp dimmer switch 78 via which control of the headlamps in the headlamp circuit portion of FIG. 5 is effected.

Referring now also to FIG. 5, one will see that terminal 74c of the master light switch connects through dimmer switch 78 to the headlamp circuits. Dimmer switch 78 is a two-position switch which selects either high beam or low beam operation. The switch has an input terminal 78a; a low beam output terminal 78b which connects both to the input terminal 14c of a left low beam intelligent switch 80 and to the input terminal 14c of a right low beam intelligent switch 82; and a high beam output terminal 78c which connects to terminal 14c of a high beam intelligent switch 84.

Terminals 14a of switches 80, 82, and 84 are connected to conductor 18. Terminal 14b of high beam switch 84 connects to the high beam filaments of the two headlamps 85, 87. It also connects to a high-beam indicator lamp 86 on the instrument panel. Terminal 14b of switch 80 connects to the low beam filament of the left headlamp 85 while terminal 14b of the right low-beam switch 82 connects to the low beam filament of the right headlamp 87.

Therefore, when the master light switch 74 is in the head position and the dimmer switch 78 is in the low beam position, the low beams of both headlamps are illuminated. With the master light switch remaining in the head position, switching of the dimmer switch to the high beam position causes current flow to the low beam filaments of the headlamps to cease and current flow to the high beam filaments of both headlamps to begin through switch 84. High beam indication is given to the vehicle operator by the illumination of lamp 86.

The low beam output terminal 78b of dimmer switch 78 is also connected to one terminal of a normally open fog light switch 89. The other terminal of the fog light switch in turn connects to the terminal 14c of an intelligent switch 88 whose terminal 14a connects to conductor 18 and whose terminal 14b connects to the right and left fog lamps 91, 93. Therefore, when the master light switch 74 is in the head position, and the dimmer switch 78 is in the low beam position to illuminate the low beams, the fog lamps are rendered selectively operable through closing of the fog light switch 89.

Still referring to FIG. 5, the reader will observe another intelligent switch 90 whose terminal 14a connects to conductor 18 and whose terminal 14b connects to a large number of illumination lamps 92 for illuminating instruments on the instrument panel. When the intelligent switch 90 is conductive, the lamps 92 are continuously illuminated with the full battery voltage. However, the switch is impressed with a duty cycle type of operation via a variable duty cycle timer circuit 94 which connects between terminal 74c of master light switch 74 (FIG. 4) and terminal 14c of intelligent switch 90 (FIG. 5).

Timer circuit 94 comprises a potentiometer 96 and a timer 98. The timer receives a selectable fraction of the voltage from the master light switch as determined by the setting of the potentiometer. The timer executes a corresponding duty cycle of operation to thereby impose a similar duty cycle on the intelligent switch. Accordingly, the average power input to the illumination lamps 92 is a function of the setting of the potentiometer. This provides the vehicle operator with the capability of setting a desired illumination intensity for the instrument panel lamps by the setting of potentiometer 96.

FIG. 6 illustrates another circuit 110 which contains three intelligent switches 112, 114, 116. These switches are used in control of the stop and turn signal lamps and are cooperatively associated with a combination hazard/turn signal switch 117 and a stop lamp switch 118.

The highway tractor, itself, comprises left and right front turn signal lights 120, 122, respectively, and left and right rear, stop, tail and turn lights 124, 126, respectively. The components 112–126 are connected in circuit as shown in FIG. 6. The low intensity filaments of the lamps 124, 126 connect to switch 58 of circuit 50 (FIG. 4) and illuminate when switch 58 is conductive.

Looking further at FIG. 6 one sees a socket 128 for connecting to a mating plug (not shown) on an associated trailer and containing a terminal 128a enabling a left stop, tail and turn signal lamp, or lamps, on the trailer to be connected in parallel with lamp 124. The same socket contains a terminal 128b enabling a right stop, tail and turn lamp, or lamps, of the trailer to be connected in parallel with lamp 126. A third terminal 128c in the socket connects to the terminal 14b of switch 116 and serves to feed additional stop lamps on the trailer. The lamps 124, 126 connect respectively to the terminals 14b of switches 112, 114 respectively.

The drawing illustrates switch 117 in a non-turn, non-hazard condition. The stoplight switch 118 is connected to a stoplight feed input terminal 117a of switch 117. With the switch 117 in the position illustrated in the drawing figure, closure of the stoplight switch 118 causes both switches 112 and 114 to be rendered conductive. This causes a red stop signal to be given toward the rear by the illumination of lamps 124, 126 and the corresponding lamps on the trailer. The lamps 120, 122 are also illuminated to present an amber signal toward the front, an added feature.

Operation of switch 117 to either the right or the left turn signal function disconnects the corresponding switch 112, 114 from the stoplight switch feed and connects the corresponding switch 112, 114 to a timer circuit 136 which now exercises control over the switch. The timer circuit intermittently operates the corresponding switch in a predetermined duty cycle appropriate for the turn indication function, causing the corresponding turn signal and stop lamps to be operated in a flashing manner independent of operation of the stoplight switch 118.

When the switch 117 is operated to the hazard mode, both switches 112, 114 are disconnected from the stoplight switch feed, and are instead both connected to timer circuit 136 which causes the two switches 112, 114 to intermittently operate in unison thereby flashing in unison the lamp loads which are connected to them.

FIG. 7 illustrates a dual blower motor control circuit 140. This circuit comprises two blower motors 142, 144 and two intelligent switches 146, 148. Each motor forms a load which connects to the corresponding terminal 14b of the corresponding switch 146, 148. The motors are of the variable speed D.C. type, and speed control is effected by the duty cycle modulation of battery voltage across the motors.

To achieve variable speed capability for the motors, circuit 140 further comprises a control switch 150 and a control module 152. The control module comprises two timer circuits 154, 156 imparting different duty cycles of operation. Control switch 150 may be considered to have four inputs and a single output. There are three input terminals 150a, 150b, and 150c available for external connection, high, medium and low, and a fourth input represents off position. The output terminal 150d of the control switch is connected to terminal 14c of both switches 146, 148. Timer circuit 156 is connected to the low input, timer 154 circuit to the medium input, and a positive potential reference is connected to the high input.

When the control switch is in the off position, the switches 146, 148 are rendered non-conductive. When the switch is operated to the low position, timer circuit 156 exercises control over the duty cycle operation of the switches to produce low speed operation for both motors. When the switch is operated to the medium position, timer circuit 154 exercises control to produce a higher duty cycle mode of operation resulting in an increased speed over the low speed. When the switch is at the high setting, the full continuous voltage is applied to the switches so that the switches are continuously conductive so long as the control switch 150 remains in this setting, and the motors run at high speed.

In the several embodiments of the invention disclosed above, the intelligent switches provide the entire circuit protection such that separate conventional electromechanical protection devices such as fuses and circuit breakers are not incorporated into the circuits. Power for the various loads is conducted from the D.C. power supply through the intelligent switches to the loads, and not through the control circuitry. The circuitry which controls the switching of the intelligent switches advantageously consists of low-current, low-power components. Such components possess cost and reliability advantages over heretofore used mechanical switches which must be large enough themselves to carry the load currents for the various load devices they control. The low-current, low-power components are smaller and can be more compactly organized and arranged in the electrical system. Attendant savings accrue in the associated wiring harnesses both by way of simplification and because the low-power control circuitry uses smaller conductors and terminals.

According to a preferred implimentation of the invention, the terminals 14a of the intelligent switches are connected directly to a positive voltage buss from the battery. Hence, the load on an intelligent switch and all conductors associated with the load, save the buss of course, are on the load side of the intelligent switch and are protected by the intelligent switch.

The stop, tail, turn, and hazard signal circuit of FIG. 6 possesses significant improvement over its previous counterpart. While endowed with the advantages which have been described generally thus far, the circuit has the specific advantage of simplifying inventory requirements in plants where the vehicles are built. Because different models of vehicles may have differing numbers of lamps, several different models of flashers have been required to handle the different loads using the previous conterpart circuit. With the invention a common low-power control, including timer for producing lamp flashing, is used, and the various load requirements are handled by using the appropriate number of intelligent switches thus effectively distributing load currents and reducing component peak currents.

The blower circuit of FIG. 7 also affords significant improvement over its prior counterpart. The prior dual-blower heater uses two auto reset circuit breakers, a dual high-current four-position switch, two relays, and two resistor and thermal fuse assemblies to provide protection and the three-speed operation. With the present invention, they are replaced by two intelligent switches, a single low-current four-position switch, and a dual timer/pulse width modulator circuit.

In any given design of system containing one or more branch circuits embodying principles of the invention, conventional engineering practices should be observed. The rating of an intelligent switch should be selected to correspond with and protect the load in its branch. In many installations the actual D.C. source, i.e. the battery, for example, will be physically remote from the branch or branches, despite the fact that the branch or branches are electrically across the power source. For instance a branch could be fed from a buss, and in such a case there could be an overload protection device upstream of the branch for the purpose of protecting the buss, and it is to be appreciated that the present invention provides branch protection within the branch irrespective of the presence or absence of any protection devices for protecting external feeds to the branch, such as just described. Principles of the invention in its generic aspects are independent of the particular type of electrical load being protected. Likewise the generic aspects of the invention are not limited to any particular type of device which exercises control of the conductivity of the intelligent switch. Examples of representative control devices are mechanical switches, electronic switches, and microprocessors.

While the foregoing disclosure has portrayed general principles of the invention in several specific embodiments, it is to be appreciated that principles are applicable to other embodiments with the attendant benefits of fuse and circuit breaker elimination, a greater degree of individual circuit protection, and savings in time, labor, and materials, as well as space savings in the vehicles.

What is claimed is:

1. In a D.C. electrical distribution system comprising a D.C. power supply and a branch connected across said power supply, said branch comprising an electrical load, a switch, conductors, and an overload protector all serially connected, said switch being selectively operable to selectively control the current flow through the branch, said overload protector serving to sense overload associated with the flow of current in the branch and interrupt the current flow upon sensing overload to thereby protect the branch against overload, the improvement which comprises said switch and said overload protector being embodied in a solid state unit which comprises terminals via which it connects in the system, said unit comprising semiconductor structure which comprises a main controlled conduction path through the unit having a certain current/temperature rating and an associated overload protector for said main controlled conduction path responsive to incipient current or temperature exceeding said rating to protect said main controlled conduction path from potential damage, two of said terminals constituting external termination points for said main controlled conduction path via which said main controlled conduction path connects into the branch, at least one other of said terminals constituting an external termination point for connection to an input for selectively controlling the conductivity of said main controlled conduction path in accordance with said input thereby selectively controlling the conductivity of said main controlled conduction path to perform the switch function, said branch being free of separate overload protection devices external to said unit such that the current overload protection function within the branch is performed entirely by the protection of said main controlled conduction path within said unit by the associated overload protector.

2. The improvement set forth in claim 1 in which said D.C. power supply comprises a D.C. battery having positive and negative terminals, one of said two terminals of said unit being directly connected to a buss which is connected directly to the positive terminal of the battery, and said load being connected between the other of said two terminals of said unit and the negative battery terminal.

3. The improvement set forth in claim 1 in which said D.C. power supply comprises a battery having a pair of terminals across which exists a potential difference, one of said battery terminals being at the system's ground, said load being on the ground side of the system relative to said unit.

4. The improvement set forth in claim 1 in which said one of said two terminals of said unit is connected directly to said D.C. power supply and said at least one other of said terminals of said unit is connected to said one of said two terminals of said unit such that said main controlled conduction path is continuously commanded to full conductivity condition.

5. The improvement set forth in claim 4 in which said load comprises its own switch for selectively controlling its own energization.

6. The improvement set forth in claim 1 in which said input comprises a selectively operable device to select the conductivity of said main controlled conduction path between a fully conductive condition and a nonconductive condition.

7. The improvement set forth in claim 6 in which said load comprises a stop lamp on one side of a motor vehicle, said system further comprises a second branch across the power supply containing a second such unit and a stop lamp on the other side of the motor vehicle, said second branch being free of separate overload protection devices external to said second unit such that the current overload function within the second branch is performed entirely by the protection of the main controlled conduction path within said second unit by the associated overload protector, and said selectively operable device comprises the combination of a combined turn signal/hazard warning switch and a stop lamp switch coacting to comprise means for causing a stop signal to be given by at least one stop lamp by the continuous energization thereof when the stop lamp switch is operated, for causing at least one stop lamp to be intermittently energized and give a turn signal when said combined turn signal/hazard warning switch is operated for a turn signal, and for causing both stop lamps to be intermittently energized and give a hazard warning signal when said combined turn signal/hazard warning switch is operated for a hazard warning signal.

8. The improvement set forth in claim 6 in which said load comprises headlamps of a motor vehicle which are selectively operable to high and low beam modes of illumination by means of selective energization of respective high and low beam lamp filaments, said unit being connected with one of said filaments, and further including a second such unit connected with the other of said filaments to form a second branch across the power supply, said two units being under the control of a headlamp switch operatively connected through a selectively operable dimmer switch to said at least one other terminal of said two units to selectively connect said at least one other terminal of said two units to said headlamp switch, and said second branch being free of separate overload protection devices external to said second unit such that the current overload protection function within the second branch is performed entirely by the protection of the main controlled conduction path within said second unit by its associated overload protector.

9. The improvement set forth in claim 8 further including a third such unit having a fog lamp load to form a third branch across the power supply, said at least one other terminal of said third unit being connected through a fog lamp switch to said dimmer switch such that said third unit is enabled to be rendered conductive by said fog lamp switch only when said dimmer switch is operating said headlamps to low beam mode, and said third branch being free of separate overload protection devices external to said third unit such that the current overload protection function within the third branch is performed entirely by the protection of the main controlled conduction path within said third unit by its associated overload protector.

10. The improvement set forth in claim 8 further including a third such unit having a marker lamp load to form a third branch across the power supply, said at least one other terminal of said third unit being connected through a light interrupter switch to said headlamp switch such that said marker lamp load is energized through said third unit when said headlamp switch is operated to cause the headlamps to be illuminated and said interrupter switch remains closed, said interrupter switch being operable to cause the energization of the marker lamp load to be interrupted while the headlamps remain illuminated, and said third branch being free of separate overload protection devices external to said third unit such that the current overload protection function within the third branch is performed entirely by the protection of the main controlled conduction path within said third unit by its associated overload protector.

11. The improvement set forth in claim 6 in which said load comprises the blower motor of an automotive vehicle heater, said input comprises a multi-position switch and at least one duty cycle timer circuit, said multi-position switch being selectively operable to selectively connect said timer circuit to said at least one other terminal of said unit and cause a duty cycle mode of operation to be imparted to said unit and cause the blower motor to operate at a speed less than its full speed.

12. The improvement set forth in claim 1 in which said unit comprises said main controlled conduction path and said associated overload protector being embodied in a single integrated circuit device, and said terminals are on said single integrated circuit device to provide for its connection in said branch and to said input.

13. In a plural blower motor circuit which has a D.C. power supply, plural D.C. variable speed blower motors, and a control circuit for setting motor operation at plural speeds, the improvement which comprises each motor being in its own branch circuit across the power supply and in series with a corresponding semiconductor switch in its branch, each said semiconductor switch comprising a main controlled conduction path which has a certain current/temperature rating and through which current is conducted from said power supply to the corresponding motor and a control input which receives a control signal for controlling the conductivity of said main controlled conduction path between conductive and non-conductive conditions, each said semiconductor switch further comprising an associated internal overload protection means for protecting said main controlled conduction path against incipient current and thermal overloads exceeding the rating of said main controlled conduction path, each said branch being free of separate overload protection devices external to the corresponding switch such that the current overload protection function within each branch is performed entirely by the corresponding switch, said control circuit comprising a pulse width modulator circuit and a selectable control device coacting to provide said control signal to said control inputs as a pulse width modulated signal thereby imposing a duty cycle operation on said switches in accordance with the selection of said selectable control device and provide for motor speed operation at a speed less than full motor speed.

14. The improvement set forth in claim 13 in which said selectable control device comprises a multi-position selector switch.

15. The improvement set forth in claim 14 in which there are plural such pulse width modulator circuits which are selectively connectable with said first-mentioned switches by the selection of the position of said multi-position selector switch, each pulse width modulator circuit producing a different speed of operation for the motors.

16. In an automotive vehicle stop lamp circuit in which a stop lamp performs stop, turn, and hazard warning signaling functions, said circuit being powered from a D.C. power supply of the vehicle, and a stop, turn and hazard warning switch means operates the stop lamp, the improvement which comprises a semiconductor switch connecting the stop lamp in a branch across the power supply, said semiconductor switch comprising a main controlled conduction path which has a certain current/temperature rating and through which current is conducted from said power supply to the stop lamp and a control input which receives a control signal for controlling the conductivity of said main controlled conduction path between conductive and non-conductive conditions, said semiconductor switch further comprising an associated internal overload protection means for protecting said main controlled conduction path against incipient current and thermal overloads exceeding the rating of said main controlled conduction path, said branch being free of separate overload protection devices external to the semiconductor switch such that the current overload protection function within the branch is performed entirely by the protection of said main controlled conduction path within said semiconductor switch by the associated internal overload protection means, said switch means comprises the combination of a combined turn signal/hazard warning switch and a stop lamp switch coacting to produce said control signal for causing a stop signal to be given by the stop lamp by rendering said semiconductor switch continuously conductive when the stop lamp switch is operated, for causing the stop lamp to give a turn signal by rendering said semiconductor switch intermittently conductive when said combined turn signal/hazard warning switch is operated for a turn signal, and for causing the stop lamp to give a hazard warning signal by rendering said semiconductor switch intermittently conductive when said combined turn signal/hazard switch is operated for a hazard warning signal.

17. In an automotive vehicle headlamp circuit comprising a headlamp load operable to high and low beam modes of operation, said circuit being powered from a D.C. power supply of the vehicle, and switch means for operating the headlamp load, the improvement which comprises plural semiconductor switches connecting the headlamp load in respective high and low beam branches across the power supply, one such switch in the high beam branch for operating the headlamp load to the high beam mode, another such switch in the low beam branch for operating the headlamp load to the low beam mode, each said semiconductor switch comprising a main controlled conduction path which has a certain current/temperature rating and through which current is conducted from said power supply to the headlamp load and a control input which receives a control signal for controlling the conductivity of said main controlled conduction path between conductive and non-conductive conditions, each said semiconductor switch further comprising an associated internal overload protection means for protecting its main controlled conduction path against incipient current and thermal overloads exceeding the rating of its main controlled conduction path, the path for current flow in each branch through the corresponding switch to the headlamp load being free of separate overload protection devices external to the corresponding switch such that the current overload protection function within the corresponding branch is performed entirely by the protection of the main controlled conduction path within the corresponding including the combination of a main headlight switch and a dimmer switch coacting to produce said control signal and selectively apply same to the control inputs of said semiconductor switches as selected by said dimmer switch to selectively produce high and low beam modes of operation for the headlamp load.

18. The improvement set forth in claim 17 further including a further such semiconductor switch having a fog lamp load to form a further branch across the power supply, said control input of said further switch being connected through a fog lamp switch to said dimmer switch such that said further switch is enabled to be rendered conductive by said fog lamp switch only when said headlight switch and dimmer switch are operating said headlamp load to low beam mode, and said further branch being free of separate overload protection devices external to said further switch such that the current overload protection function within the further branch is performed entirely by the protection of the main controlled conduction path within said further switch by the associated internal overload protection means.

19. The improvement set forth in claim 17 further including a further such semiconductor switch having a marker lamp load to form a further branch across the power supply, said control input of said further such switch being connected through a light interrupter switch to said headlight switch such that said marker lamp load is energized through said further switch when said headlight switch is operated to cause the headlamp load to be illuminated and said interrupter switch remains closed, said interrupter switch being operable to cause the energization of the marker lamp load to be interrupted while the headlamp load remains illuminated, and said further branch being free of separate overload protection devices external to said further switch such that the current overload protection function within the further branch is performed entirely by the protection of the main controlled conduction path within said further switch by the associated internal overload protection means.

20. The improvement set forth in claim 17 including a taillamp load coupled via a further such semiconductor switch across the power supply to form a further branch, said headlight switch being coupled to the control input of said further switch, said headlight switch comprising two output terminals coupled together through a diode, said two output terminals of said headlight switch being selectively connected to the power supply by the selective operation of said headlight switch to respective head and tail positions, said headlamp and said taillamp loads both being energized by operation of the associated semiconductor switches when the headlight switch is operated to the head position, and only said taillamp load, and not said headlamp load, being energized by operation of only said further switch when the headlight switch is operated to the tail position, and said further branch being free of separate overload protection devices external to said further switch such that the current overload protection function within the further branch is performed entirely by the protection of the main controlled conduction path within said further switch by the associated overload protection means.

21. The improvement set forth in claim 17 including an instrument panel lamp load coupled via a further such semiconductor switch across the power supply to form a further branch, said headlight switch being coupled to the control input of said further switch by a variable duty cycle timer circuit connected between the headlight switch and the control input of the further switch including means for selecting the duty cycle of operation to be imposed by the variable duty cycle timer circuit on said further switch to cause the intensity of illumination of the instrument panel lamp load to be selected to a level less than full intensity, and said further branch being free of separate overload protection devices external to said further switch such that the current overload protection function within the further branch is performed entirely by the protection of the main controlled conduction path within said further switch by the associated overload protection means.

22. In an automotive vehicle headlamp circuit comprising a headlamp load operable to high and low beam modes of operation, said circuit being powered from a D.C. power supply of the vehicle, and switching means for operating the headlamp load, the improvement which comprises said switching means comprising plural switch means connecting the headlamp load in respective high and low beam branches across the power supply, one such switch means in the high beam branch for operating the headlamp load to the high beam mode, another such switch means in the low beam branch for operating the headlamp load to the low beam mode, each said switch means comprising a main controlled conduction path through which current is conducted from said power supply to the headlamp load and a control input which receives a control signal for controlling the conductivity of the switch means' main controlled conduction path, and including the combination of a main headlight switch and a dimmer switch coacting to produce said control signal and selectively apply same to the control inputs of said switch means as selected by said dimmer switch to selectively produce high and low beam modes of operation for the headlamp load, further including a further such switch means having a marker lamp laod to form a further branch across the power supply, said control input of said further such switch means being connected through a light interrupter switch to said headlight switch such that said marker lamp load is energized through said further switch means when said headlight switch is operated to cause the headlamp load to be illuminated and said interrupter switch remains closed, said interrupter switch being operable to cause the energization of the marker lamp load to be interrupted while the headlamp load remains illuminated.

23. In an automotive vehicle headlamp circuit comprising a headlamp load operable to high and low beam modes of operation, said circuit being powered from a D.C. power supply of the vehicle, and switching means for operating the headlamp load, the improvement which comprises said switching means comprising plural switch means connecting the headlamp load in respective high and low beam branches across the power supply, one such switch means in the high beam branch for operating the headlamp load to the high beam mode, another such switch means in the low beam branch for operating the headlamp load to the low beam mode, each said switch means comprising a main controlled conduction path through which current is conducted from said power supply to the headlamp load and a control input which receives a control signal for controlling the conductivity of the switch means' main controlled conduction path, and including the combination of a main headlight switch and a dimmer switch coacting to produce said control signal and selectively apply same to the control inputs of said switch means as selected by said dimmer switch to selectively produce high and low beam modes of operation for the headlamp load, including a taillamp load coupled via a further such switch means across the power supply to form a further branch, said headlight switch being coupled to the control input of said further switch means, said headlight switch comprising two output terminals coupled together through a diode, said two output terminals of said headlight switch being selectively connected to the power supply by the selective operation of said headlight switch to respective head and tail positions, said headlamp and said taillamp loads both being energized by operation of the associated switch means when the headlight switch is operated to the head position, and only said taillamp load, and not said headlamp load, being energized by operation of only said further switch means when the headlight switch is operated to the tail position.

24. In an automotive vehicle headlamp circuit comprising a headlamp load operable to high and low beam modes of operation, said circuit being powered from a D.C. power supply of the vehicle, and switching means for operating the headlamp load, the improvement which comprises said switching means comprising plural switch means connecting the headlamp load in respective high and low beam branches across the power supply, one such switch means in the high beam branch for operating the headlamp load to the high beam mode, another such switch means in the low beam branch for operating the headlamp load to the low beam mode, each said switch means comprising a main controlled conduction path through which current is conducted from said power supply to the headlamp load and a control input which receives a control signal for controlling the conductivity of the switch means' main controlled conduction path, and including the combination of a main headlight switch and a dimmer switch coacting to produce said control signal and selectively apply same to the control inputs of said switch means as selected by said dimmer switch to selectively produce high and low beam modes of operation for the headlamp load, including an instrument panel lamp load coupled via a further such switch means across the power supply to form a further branch, said headlight switch being coupled to the control input of said further switch means by a variable duty cycle timer circuit connected between the headlight switch and the control input of the further switch means including means for selecting the duty cycle of operation to be imposed by the variable duty cycle timer circuit on said further switch means to cause the intensity of illumination of the instrument panel lamp load to be selected to a level less than full intensity.

* * * * *